(12) United States Patent
Wada et al.

(10) Patent No.: US 6,325,698 B1
(45) Date of Patent: Dec. 4, 2001

(54) CLEANING METHOD AND POLISHING APPARATUS EMPLOYING SUCH CLEANING METHOD

(75) Inventors: Yutaka Wada, Chigasaki; Hirokuni Hiyama, Tokyo; Norio Kimura, Fujisawa, all of (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/387,553

(22) Filed: Sep. 1, 1999

(30) Foreign Application Priority Data

Sep. 1, 1998 (JP) .................................................. 10-246799

(51) Int. Cl.[7] .................................................. B24B 49/00
(52) U.S. Cl. .................................. 451/8; 451/56; 451/60; 451/41; 51/308
(58) Field of Search ............................. 451/518, 36, 37, 451/41, 56, 60, 287, 288, 290; 51/308

(56) References Cited

U.S. PATENT DOCUMENTS

| 5,078,801 | * | 1/1992 | Malik | 134/29 |
|---|---|---|---|---|
| 5,575,706 | * | 11/1996 | Tsai et al. | 451/41 |
| 5,934,980 | * | 8/1999 | Koos et al. | 451/41 |
| 5,993,639 | * | 11/1999 | Miyashita et al. | 134/742 |
| 6,001,238 | * | 12/1999 | Takayasu et al. | 205/742 |
| 6,007,696 | * | 12/1999 | Takayasu et al. | 205/747 |
| 6,022,400 | * | 2/2000 | Tzumi et al. | 106/3 |
| 6,145,519 | * | 11/2000 | Konishi et al. | 134/95.2 |

FOREIGN PATENT DOCUMENTS 60-196950    10/1985    (JP) .
8-107094     4/1996    (JP) .

* cited by examiner

Primary Examiner—M. Rachuba
(74) Attorney, Agent, or Firm—Wenderoth, Lind & Ponack, L.L.P.

(57) ABSTRACT

A method is suitable for cleaning substrates, after polishing, that require a high degree of cleanliness, such as semiconductor wafers, glass substrates, or liquid crystal displays. The method includes polishing a substrate using an abrasive liquid containing abrasive particles, and cleaning a polished surface of the substrate by supplying a cleaning liquid having substantially the same pH as the abrasive liquid or similar pH to the abrasive liquid so that a pH of the abrasive liquid attached to the polished surface of the substrate is not rapidly changed.

11 Claims, 7 Drawing Sheets

CLEANING METHOD AND POLISHING APPARATUS EMPLOYING SUCH CLEANING METHOD

BACKGROUND OF THE INVENTION

1. Field of the Invention

The present invention relates to a cleaning method and a polishing apparatus employing such cleaning method, and more particularly to a cleaning method suitable for cleaning substrates that require a high degree of cleanliness, such as semiconductor wafers, glass substrates, or liquid crystal displays, and to a polishing apparatus employing such cleaning method.

2. Description of the Related Art

As semiconductor devices have become more highly integrated in recently years, circuit interconnections on semiconductor substrates become finer and the distances between those circuit interconnections have become smaller. One of the processes available for forming such circuit interconnections is photolithography. In the case where circuit interconnections are formed by the photolithography or the like, it requires that surfaces on which patterns images are to be focused by a stepper be as flat as possible because the depth of focus of the optical system is relatively small.

Figure 8:
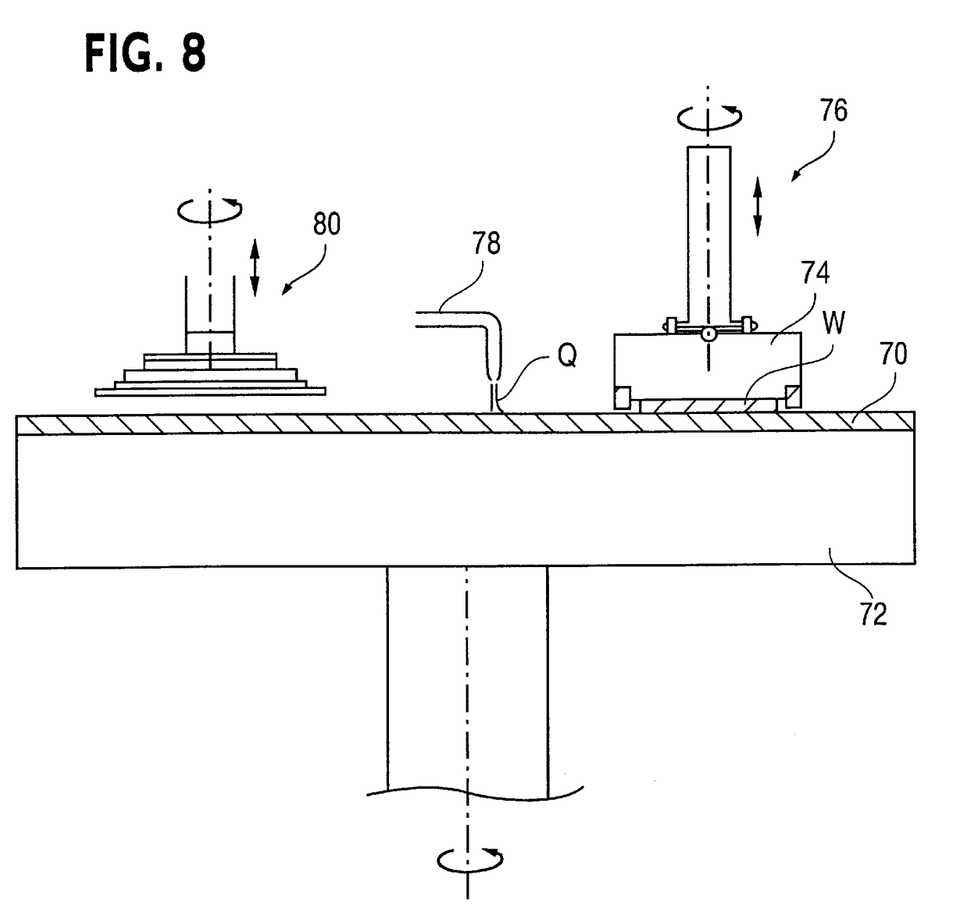
FIG. 8 is a front view of a conventional polishing apparatus.

It is therefore necessary to make the surfaces of semiconductor substrates flat for photolithography. One customary way of flattening the surfaces of the semiconductor substrates is to polish them with a polishing apparatus. As shown in FIG. 8, a conventional polishing apparatus 76 comprises a turntable 72 having a polishing cloth 70 thereon, and a top ring 74 for holding a semiconductor substrate W and pressing the semiconductor substrate W against the turntable 72. In the polishing apparatus, a chemical mechanical polishing (CMP) of the substrate is performed by a combination of chemical polishing with an abrasive liquid and mechanical polishing with abrasive particles contained in the abrasive liquid. An abrasive liquid supply nozzle 78 is provided above the turntable 72 to supply the abrasive liquid Q to the polishing cloth 70. Further, a dressing device 80 is provided to regenerate, i.e. dress the polishing cloth 70.

Figure 9:
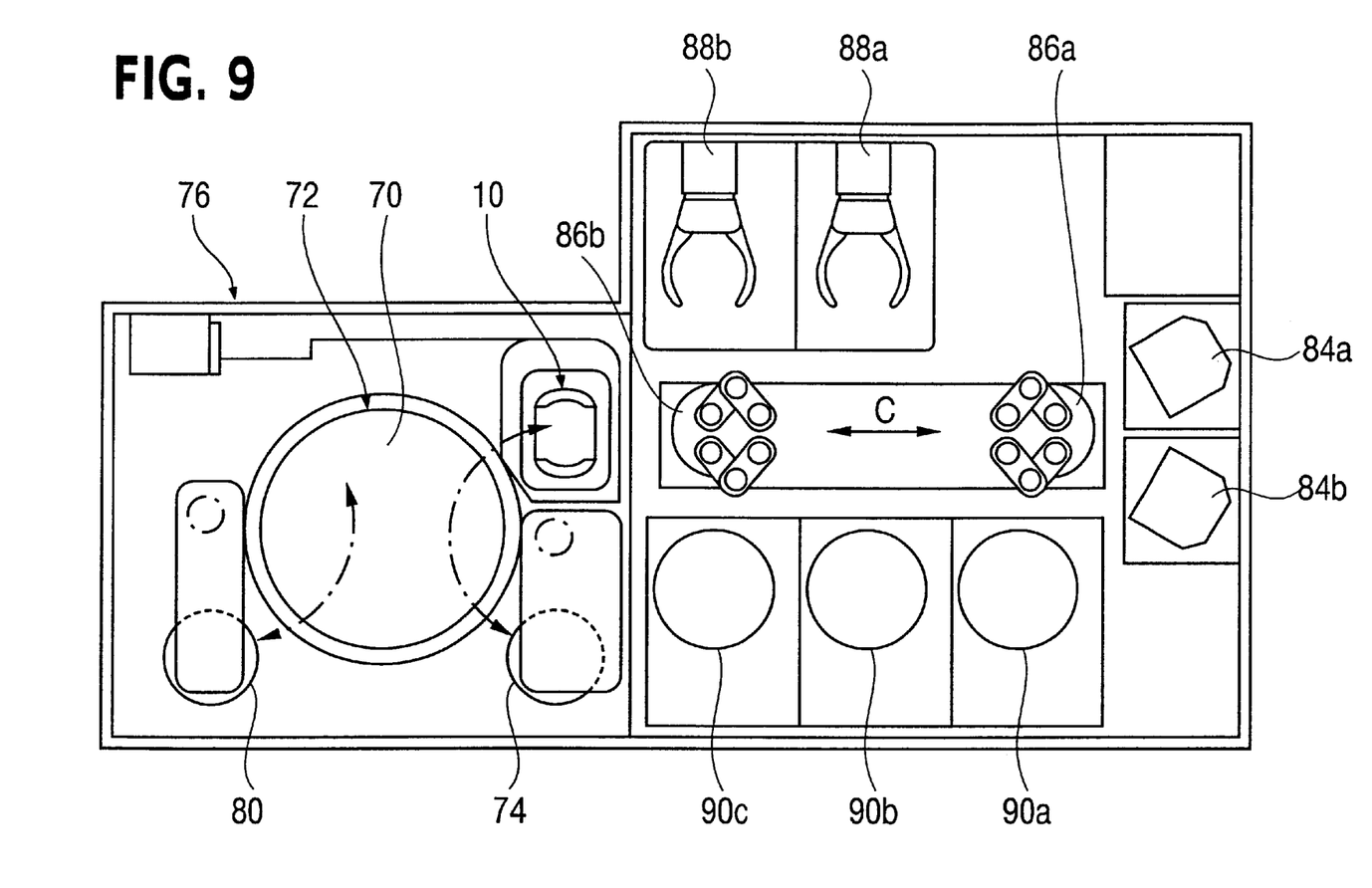
FIG. 9 is a plan view of the conventional polishing apparatus.

FIG. 9 shows a CMP unit which is constructed as an integral unit having the polishing apparatus 76 shown in FIG. 8 and various devices associated with the polishing apparatus 76. The CMP unit has a substantially rectangular shape in plan, and the polishing apparatus 76 is disposed at one side of the CMP unit, and load and unload units 84a, 84b for placing wafer cassettes which accommodate semiconductor substrates to be polished are disposed at the other side of the CMP unit. Transfer robots 86a, 86b are movably provided between the polishing apparatus 76 and the load and unload units 84a, 84b so that the transfer robots 86a, 86b are movable along a transfer line C. Reversing devices 88a, 88b for reversing a semiconductor substrate are disposed at one side of the transfer line C, and cleaning apparatuses 90a, 90b, 90c for cleaning the semiconductor substrate are disposed at the other side of the transfer line C. A pusher 10 is disposed adjacent to the turn table 72 to transfer the semiconductor substrate between the top ring 74 and the pusher 10 by vertical movement thereof.

In the polishing apparatus 76 having the above structure, the semiconductor substrate w is held by the lower surface of the top ring 74 and pressed against the polishing cloth 70 on the turntable 72. The abrasive liquid Q is supplied from the abrasive liquid supply nozzle 78 onto the polishing cloth 70 and retained on the polishing cloth 70. During operation, the top ring 74 exerts a certain pressure on the turntable 72, and the surface of the semiconductor substrate held against the polishing cloth 70 is therefore polished in the presence of the abrasive liquid Q between the surface of the semiconductor substrate w and the polishing cloth 70 by a combination of chemical polishing and mechanical polishing while the top ring and the turntable are rotated. The abrasive liquid Q contains various abrasive particles, and the pH of the abrasive liquid Q is adjusted in accordance with the kind of semiconductor substrates to be polished.

As described above, as semiconductor devices have become more highly integrated, circuit interconnections on semiconductor substrates become finer and the distances between those circuit interconnections have become smaller. Therefore, in the above polishing process, if a particle greater than the distance between interconnections adheres to a semiconductor substrate and thus such particle remains on the product, i.e. semiconductor device, then the particle will short-circuit interconnections on the semiconductor device. Therefore, any undesirable particles on the semiconductor substrate have to be sufficiently smaller than the distance between interconnections on the semiconductor substrate. Such a problem and a requirement hold true for the processing of other substrates including a glass substrate to be used as a mask, a liquid crystal panel, and so on.

In the above-mentioned CMP process, the semiconductor substrate which has been polished is transferred to the cleaning apparatuses 90a, 90b and 90c. In the cleaning apparatuses 90a, 90b and 90c, for example, a scrubbing cleaning process in which a cleaning member such as a brush or a sponge is used to scrub a surface of the semiconductor substrate while supplying a cleaning liquid such as pure water, and a spinning dry process subsequent to the scrubbing cleaning process are performed, and the abrasive particles or the ground-off particles attached to the semiconductor substrate during the polishing process are removed from the semiconductor substrate.

When pure water (deionized water) is supplied to the semiconductor substrate which has been polished, the pH of the abrasive liquid remaining on the semiconductor substrate changes greatly. Therefore, in some cases, abrasive particles which have been dispersed in the abrasive liquid having an original pH are aggregated together, and adhere to the surface of the semiconductor substrate. For example, in slurry of colloidal silica which is generally used for polishing a $SiO_2$ layer, silica particles which are abrasive particles are stable in alkali solution having a pH of about 10, and form secondary particles having a diameter of about 0.2, $\mu m$ due to aggregation of primary silica particles. If this slurry is rapidly diluted with pure water to lower the pH of the slurry to 7 or 8, then the electric potential on the surfaces of silica particles is rapidly changed by so-called pH shock, and the silica particles become unstable to thus aggregate the secondary particles to form larger aggregates. In this specification, the pH shock is defined as a rapid change of a pH. This holds true for the dressing process of the polishing cloth 70. To be more specific, when pure water as a dressing liquid is supplied onto the polishing cloth 70 holding the abrasive liquid Q thereon, the pH of the abrasive liquid is rapidly lowered to cause abrasive particles to aggregate. These aggregates remain on the polishing cloth 70 and cause the semiconductor substrate to form scratches in the polishing process.

SUMMARY OF THE INVENTION

It is therefore an object of the present invention to provide a cleaning method which can efficiently perform cleaning of substrates which have been polished without causing abrasive particles contained in an abrasive liquid to be aggregated.

Another object of the present invention is to provide a dressing method which can efficiently perform dressing of a polishing surface on a turntable without causing abrasive particles contained in an abrasive liquid to be aggregated on the polishing surface.

Still another object of the present invention is to provide a polishing apparatus employing such cleaning method or dressing method.

According to a first aspect of the present invention, there is provided a method for polishing and then cleaning a substrate. The method comprising polishing a substrate using an abrasive liquid containing abrasive particles, and cleaning a polished surface of the substrate by supplying a cleaning liquid having substantially the same pH as the abrasive liquid or similar pH to the abrasive liquid so that a pH of the abrasive liquid attached to the polished surface of the substrate is not rapidly changed.

In the present invention, when using silica slurry having a pH of about 10 as an abrasive liquid, the cleaning liquid whose pH is in the range of 9 to 11 may be used.

According to the present invention, the pH of the abrasive liquid attached to the substrate in the polishing process is not rapidly changed, and hence cleaning of the substrate is conducted in such a state that the abrasive particles are not aggregated due to pH shock. This cleaning process of the substrate is performed in the case where liquid other than the abrasive liquid is first supplied to the surface of the substrate after the polishing process of the substrate. This cleaning process includes rinsing of the substrate on the turntable or in the vicinity of the turntable by supplying a cleaning liquid to the substrate, and a scrubbing cleaning in which the substrate is scrubbed by a cleaning member while supplying a cleaning liquid to the substrate in a cleaning apparatus.

According to a second aspect of the present invention, there is provided a method for polishing and then cleaning a substrate. The method comprising polishing a substrate using an abrasive liquid containing abrasive particles and cleaning a polished surface of the substrate by supplying a cleaning liquid whose pH is changed during the cleaning.

In a preferred aspect, the pH of the cleaning liquid is changed from acid or alkali to neutrality. Thus, the substrate may be transferred to the next process in a stable neutral condition.

According to a third aspect of the present invention, there is provided a method for polishing a substrate and then dressing a polishing surface on a turntable. The method comprising polishing a substrate using an abrasive liquid containing abrasive particles by contacting the substrate with the polishing surface, and dressing the polishing surface by supplying a dressing liquid having substantially the same pH as the abrasive liquid or similar pH to the abrasive liquid so that a pH of the abrasive liquid on the polishing surface is not rapidly changed. According to the present invention, the polishing surface on the turntable may be dressed in such a state that the abrasive to particles are not aggregated on the polishing surface.

In a preferred aspect, the cleaning liquid or the dressing liquid comprises electrolytic ionic water. Thus, contamination of the substrate caused by a metal ion may be prevented and adjustment of the pH of the abrasive liquid may be made.

According to a fourth aspect of the present invention, there is provided an apparatus for polishing and then cleaning a substrate. The apparatus comprising a polishing apparatus for polishing a substrate using an abrasive liquid containing abrasive particles, and a cleaning apparatus for cleaning a polished surface of the substrate by supplying a cleaning liquid having substantially the same pH as the abrasive liquid or similar pH to the abrasive liquid so that a pH of the abrasive liquid attached to the polished surface of the substrate is not rapidly changed.

According to a fifth aspect of the present invention, there is provided an apparatus for polishing and then cleaning a substrate. The apparatus comprising a polishing apparatus for polishing a substrate using an abrasive liquid containing abrasive particles, and a cleaning apparatus for cleaning a polished surface of the substrate by supplying a cleaning liquid whose pH is changed during the cleaning.

According to a sixth aspect of the present invention, there is provided an apparatus for polishing a substrate and then dressing a polishing surface on a turntable. The apparatus comprising a polishing apparatus for polishing a substrate using an abrasive liquid containing abrasive particles by contacting the substrate with the polishing surface, and a dressing apparatus for dressing the polishing surface by supplying a dressing liquid having substantially the same pH as the abrasive liquid or similar pH to the abrasive liquid so that a pH of the abrasive liquid on the polishing surface is not rapidly changed.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

A polishing apparatus which uses a cleaning method of the present invention will be described with reference to FIGS. 1 through 7. The whole structure of the polishing apparatus in the present invention is the same as the conventional polishing apparatus shown in FIGS. 8 and 9, and hence the detailed description thereof is not made.

Figure 1:
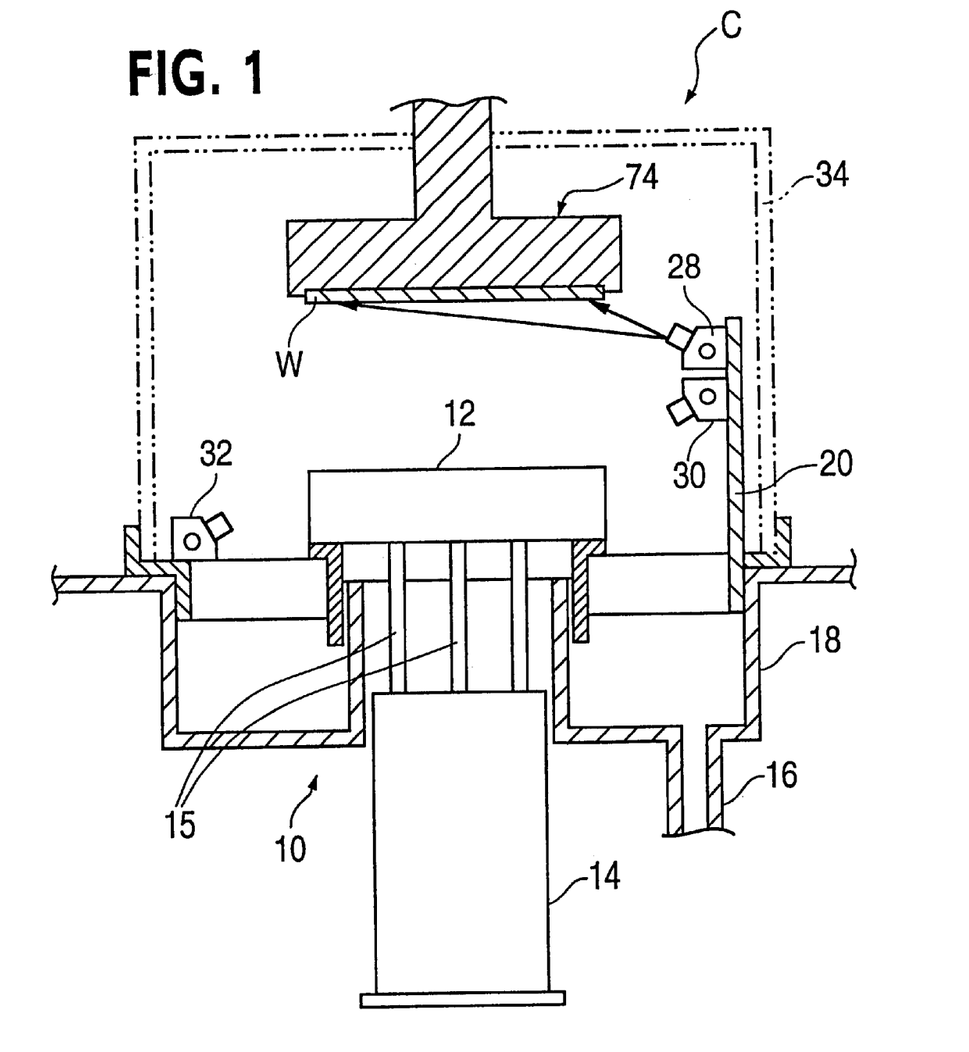
FIG. 1 is a cross-sectional view of a primary cleaning apparatus according an embodiment of the present invention.
Figure 2A:
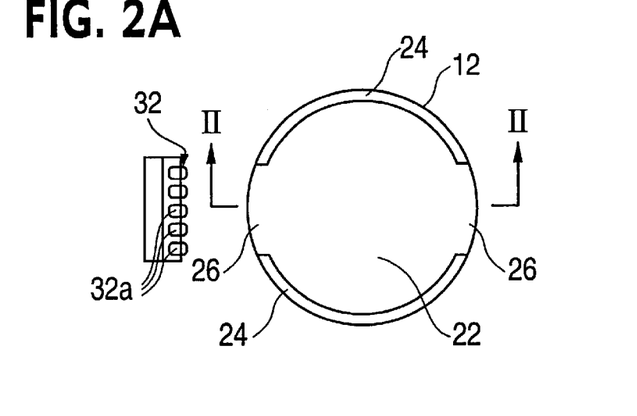
FIG. 2A is a plan view of a workpiece support in the primary cleaning apparatus shown in FIG. 1.
Figure 2B:
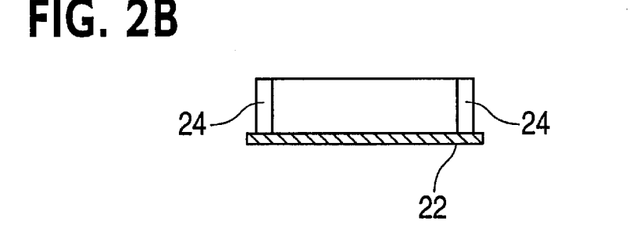
FIG. 2B is a cross-sectional view taken along line II—II of FIG. 2A.
Figure 3:
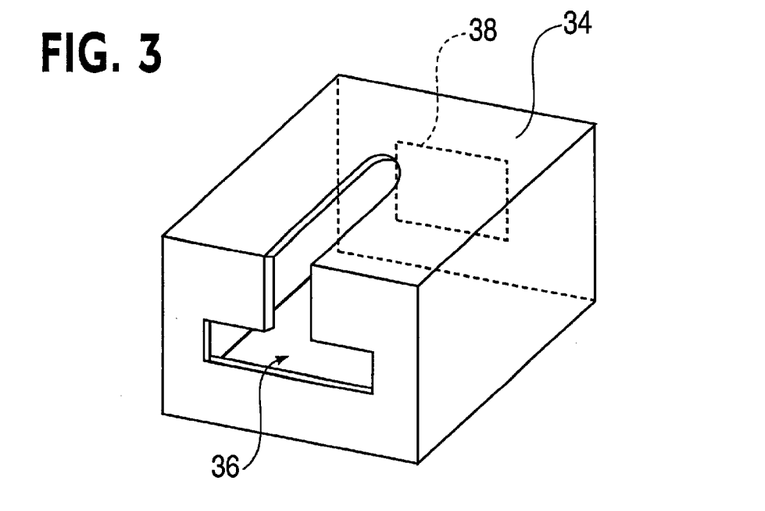
FIG. 3 is a perspective view of a cover in the primary cleaning apparatus shown in FIG. 1.

As shown in FIGS. 1 through 3, the polishing apparatus of the present invention comprises a substrate transferring apparatus (pusher) 10 in which a primary cleaning apparatus C for primarily cleaning a semiconductor substrate which has been polished is provided. This primary cleaning process is defined as a cleaning process for cleaning or rinsing a polished substrate, for the first time, by supplying liquid other than the abrasive liquid. The pusher 10 comprises a workpiece support 12 for placing a semiconductor substrate thereon, and an actuator unit 14 for vertically moving the work piece support 12. The workpiece support 12 is supported on the upper ends of vertical rods 15 that are vertically movably provided from the actuator unit 14. In FIG. 1, the semiconductor substrate W is shown as being held by the top ring 74, and the workpiece support 12 is shown as being lowered. The pusher 10 further comprises a water receiving container 18 provided around the pusher 10 and having a drain port 16, and a nozzle bracket 20 attached to the inside of the container 18 for mounting nozzle units thereon.

As shown in FIGS. 2A and 2B, the workpiece support 12 has a circular base 22 and a pair of arcuate holding plates 24 mounted on an outer circumferential edge of the circular base 22 and spaced from each other by a pair of recesses 26 defined therebetween. The recesses 26 serve to receive the arm (not shown) of the transfer robot 86b (see FIG. 9) for transferring the semiconductor substrate w between the holding plates 24 and the transfer robot 86b. Three nozzle units 28, 30, 32 are mounted on the nozzle bracket 20. The upper nozzle unit 28 serves to eject a cleaning liquid to the lower surface of the top ring 74, the middle nozzle unit 30 serves to eject a cleaning liquid to the upper surface of the semiconductor substrate W placed on the workpiece support 12, and the lower nozzle unit 32 serves to eject a cleaning liquid to the lower surface of the semiconductor substrate W placed on the workpiece support 12 through the recess 26 of the workpiece support 12.

These nozzle units 28, 30 and 32 may eject a cleaning liquid having a pressure of 1.1 to 1.2 $kg/cm^2$ or cleaning liquid to which an ultra sonic wave is imparted by an ultrasonic wave generating apparatus.

As shown in FIG. 2A, the nozzle unit 32 comprising a plurality of nozzles 32a is disposed at one location along a circumferential direction of the workpiece support 12, but a plurality of nozzle units may be disposed at a plurality of locations along a circumferential direction of the workpiece support 12. The nozzle units 28 and 30 may be also disposed in the same manner as the nozzle unit 32.

As shown in FIG. 1, a cover 34 for preventing a cleaning liquid ejected from the cleaning nozzle units 28, 30 and 32 from being scattered around is provided so as to enclose a space around the pusher 10. As shown in FIG. 3, the cover 34 has a window 36 for allowing the top ring 74 to pass therethrough on one side thereof, and a window 38 for allowing the arm (not shown) of the robot 86b (see FIG. 9) to pass therethrough on the other side thereof.

Figure 4:
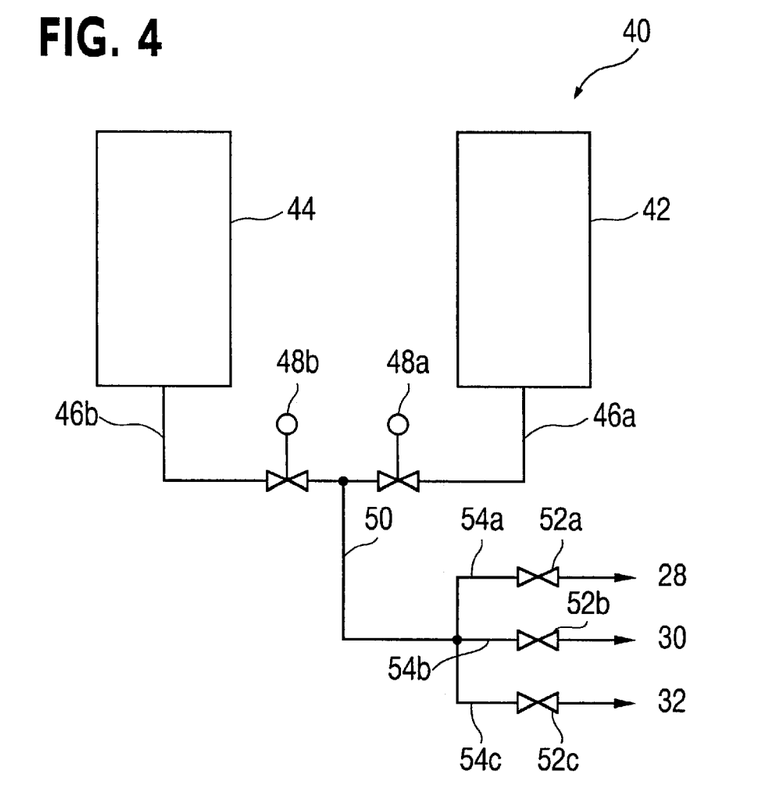
FIG. 4 is a schematic flow diagram of a cleaning liquid supply system.

As shown in FIG. 4, a cleaning liquid supply apparatus 40 is provided to supply a cleaning liquid to the nozzle units 28, 30 and 32 in the primary cleaning apparatus C. The cleaning liquid supply apparatus 40 comprises a first cleaning liquid tank 42 for storing a first cleaning liquid having a pH of a certain value, and a second cleaning liquid tank 44 for storing a second cleaning liquid which is neutral. In the case where an abrasive liquid used in the polishing process is silica slurry, the first cleaning liquid has a pH of about 10. The cleaning liquid supply apparatus 40 further comprises flow regulating valves 48a, 48b provided in pipes 46a, 46b extending from the respective cleaning liquid tanks 42 and 44, a pipe 50 connected to the pipes 46a, 46b at the downstream sides of the flow regulating valves 48a, 48b, pipes 54a, 54b and 54c branched from the pipe 50, and valves 52a, 52b and 52c provided in the respective pipes 54a, 54b and 54c. The pipes 54a, 54b and 54c are connected to the respective nozzle units 28, 30 and 32. The opening degrees of the flow regulating valves 48a, 48b may be adjusted by a controller or a timer so that first, only the first cleaning liquid is supplied, after a certain period of time has elapsed, the second cleaning liquid starts to be supplied and the ratio of the second cleaning liquid to the first cleaning liquid is gradually increased, and finally, only the neutral second cleaning liquid is supplied.

In the above embodiment, the pH of the first cleaning liquid is about 10, and KOH or the like is used for adjusting a pH of the first cleaning liquid. If the cleaning liquid having a pH of about 9 is sufficient to prevent pH shock from occurring, then electrolytic ionic water which is obtained by electrolysis using an ion exchange membrane may be used. In this case, a metal ion is not contained in the cleaning liquid, and hence there is little chance of contamination of the substrate.

Next, processes in the polishing apparatus having the above structure will be described with reference to drawings.

As shown in FIG. 8, the semiconductor substrate w is held under vacuum by the top ring 74, and pressed against the polishing cloth 70 on the turntable 72 while the abrasive liquid Q is supplied onto the polishing cloth 70. The polishing cloth 70 constitutes a polishing surface on the turntable 72. While the turntable 72 and the top ring 74 are rotated independently of each other, the lower surface of the semiconductor substrate w is polished to a flat mirror finish. After the semiconductor substrate W is polished, the ground-off particles and the abrasive liquid Q containing abrasive particles adhere to the semiconductor substrate w and the top ring 74. After completing polishing of the semiconductor substrate W, the top ring 74 which holds the semiconductor substrate W under the vacuum is angularly moved above the pusher 10, and the top ring 74 is located at the primary cleaning position inside the cover 34 as shown in FIG. 1. while the top ring 74 holds the semiconductor substrate W, a cleaning liquid is supplied from the upper nozzle unit 28 to thereby clean the polished surface of the semiconductor substrate W. In this case, only the first cleaning liquid is supplied from the first cleaning liquid tank 42 to the semiconductor substrate.

Figure 5:
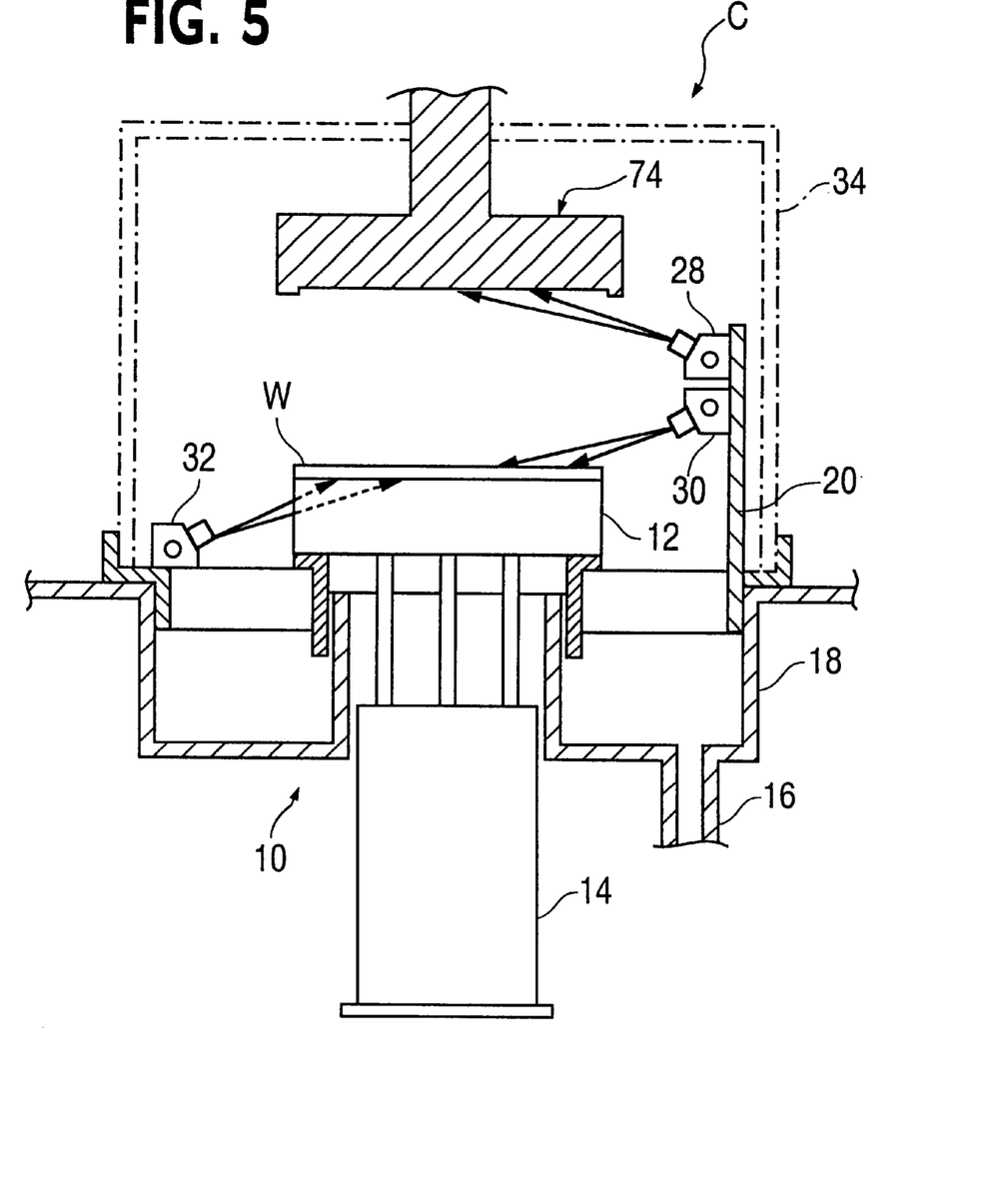
FIG. 5 is a cross-sectional view of the primary cleaning apparatus.
Figure 6:
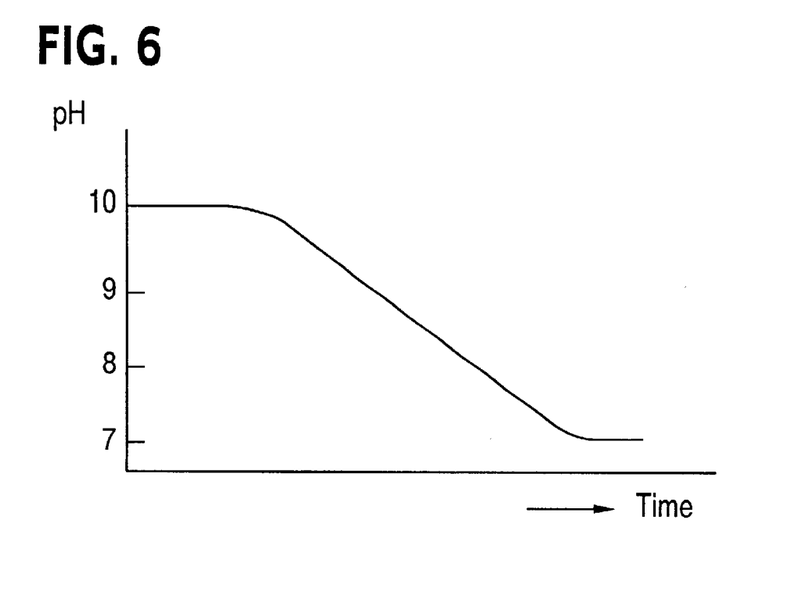
FIG. 6 is a graph showing the change of pH in the cleaning liquid in the primary cleaning process.

Then the actuator unit 14 of the pusher 10 is operated to lift the workpiece support 12 toward the top ring 74. Thereafter, the semiconductor substrate W is removed from the top ring 74 by breaking vacuum and placed on the workpiece support 12. The actuator unit 14 is operated again to lower the workpiece support 12 away from the top ring 74 as shown in FIG. 5. Then, the three cleaning nozzle units 28, 30 and 32 are simultaneously operated to eject the cleaning liquid for thereby cleaning the upper and lower surfaces of the semiconductor substrate w and the lower surface of the top ring 74. In this case, as shown in FIG. 6, first, the first cleaning liquid is supplied from the first cleaning liquid tank 42, and after a certain period time, the second cleaning liquid starts to be supplied from the second cleaning liquid tank 44 and the ratio of the second cleaning liquid to the first cleaning liquid is gradually increased. Finally, only the cleaning liquid of pH 7 is supplied from the second cleaning liquid tank 44.

In this manner, in the early cleaning stage, the cleaning process is performed to remove the abrasive particles from the semiconductor substrate and the top ring without changing a pH of the liquid attached to the semiconductor substrate and the top ring, and then the cleaning liquid is gradually shifted from alkali to neutrality and the pH of the liquid attached to the semiconductor substrate and the top ring is shifted to neutrality. Therefore, the surface of the semiconductor substrate is returned to neutrality in such a state that the liquid attached to the semiconductor substrate still contains abrasive particles without pH shock. Therefore, abrasive particles are prevented from being aggregated on the semiconductor substrate and the top ring. Further, contamination of the semiconductor substrate and the top ring caused by such abrasive particles is also prevented.

After this primary cleaning is completed, the top ring 74 is moved toward the turntable 72, and the arm of the robot 86b is moved to the pusher 10 and holds the semiconductor substrate w. The robot 86b transfers the semiconductor substrate W to the cleaning apparatuses 90a, 90b and 90c, and the subsequent cleaning processes are conducted therein using pure water. A new semiconductor substrate W is placed on the pusher 10 by the robot 86b, and the top ring 74 is moved above the pusher 10 and holds the semiconductor substrate W, and then the subsequent polishing of the new semiconductor substrate w is carried out.

In the above embodiment, the primary cleaning process of the substrate is conducted in the primary cleaning apparatus C provided in the pusher 10. However, the primary cleaning process may be conducted by the nozzle units provided above the turntable 72 or in the vicinity of the turntable 72. Further, the primary cleaning process may be conducted in the cleaning apparatuses 90a, 90b and 90c. That is, in the pusher 10 and the cleaning apparatuses 90a, 90b and 90c, the cleaning liquid may be stepwise shifted from the cleaning liquid having substantially the same pH as the abrasive liquid or similar pH to the abrasive liquid to pure water.

Figure 7:
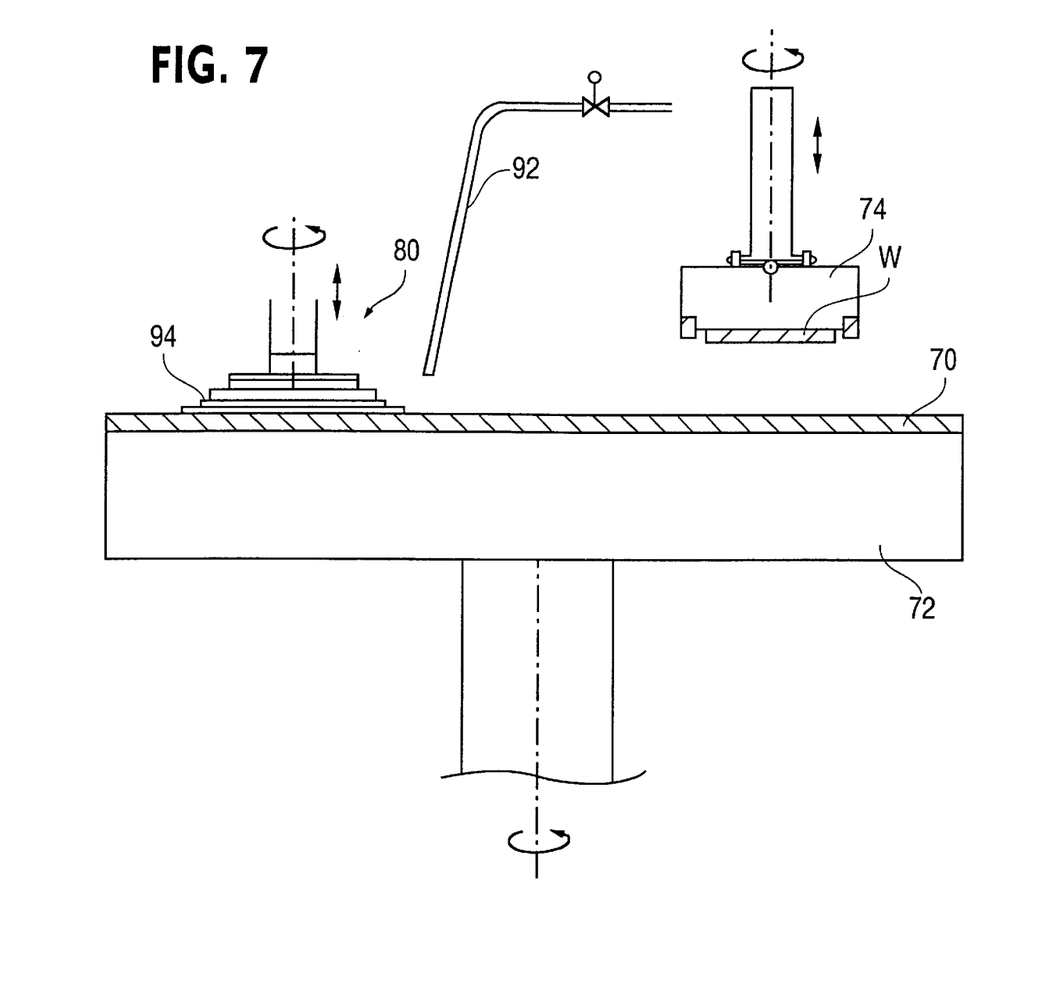
FIG. 7 is a front view of the polishing apparatus in which a dressing process is carried out.

Next, a dressing method according to another embodiment of the present invention will be described with reference to FIG. 7. As shown in FIG 7, the dressing process is conducted between the polishing processes in such a manner that a dressing tool 94 is pressed against the polishing cloth 70 while a dressing liquid is supplied from a dressing liquid supply nozzle 92 to the polishing cloth 70. In this embodiment, a dressing liquid having substantially the same pH as the abrasive liquid or similar pH to the abrasive liquid is supplied from the first cleaning liquid tank 42 shown in FIG. 4 to the polishing cloth 70. Thus, when the dressing liquid is supplied to the polishing cloth 70, the pH of the abrasive liquid remaining on the location where the dressing liquid is supplied is not greatly changed to thus prevent the abrasive particles from being aggregated.

In the dressing process, by supplying the dressing liquid having substantially the same pH as the abrasive liquid or similar pH to the abrasive liquid to the polishing cloth until a subsequent polishing of a substrate is started, the subsequent polishing of the substrate can be started in a stable condition.

In the above embodiments, the primary cleaning process has been described in the case where silica slurry is used as an abrasive liquid. If alumina ($Al_2O_3$) particles are used as abrasive particles, they are liable to being aggregated in a pH of 8 to 9, and hence it is necessary to control a pH of the abrasive liquid in the same manner as silica slurry or in the manner milder than the silica slurry.

In alumina slurry which is generally used for polishing the semiconductor substrate W, alumina ($Al_2O_3$) particles as abrasive particles are stable in acidic solution having a pH of about 4 and form secondary particles having a diameter of about 0.2 $\mu$m. In alumina slurry which is practically used, nitric acid solution is mainly used as acidic solution. In alumina slurry which is practically used for polishing, $\alpha$-alumina is mainly used as abrasive particles. Although $\alpha$-alumina is stable in a pH of 7 or below, it is desirable that $\alpha$-alumina has a pH of 3.5 to 5. Since $\alpha$-alumina is liable to being aggregated in a pH of 8 to 9, the liquid having the pH range 8–9 is not desirable as a cleaning liquid. Therefore, the liquid having a pH of 7 or below is preferable as a cleaning liquid, and the liquid having a pH of 3.5 to 5 is quite favorable.

As is apparent from the above description, according to the present invention, the pH of an abrasive liquid attached to the substrate or the polishing tool such as the top ring is not rapidly changed, and hence abrasive particles contained in the abrasive liquid are not aggregated by pH shock. Thus, the cleaning of the substrate or the dressing of the polishing cloth can be efficiently conducted.

Although certain preferred embodiments of the present invention have been shown and described in detail, it should be understood that various changes and modifications may be made therein without departing from the scope of the appended claims.

What is claimed is:

1. A method for polishing and then cleaning a substrate, said method comprising:

polishing a substrate using an abrasive liquid containing abrasive particles; and cleaning a polished surface of the substrate by supplying a cleaning liquid having substantially the same pH as the abrasive liquid or similar pH to the abrasive liquid so that the pH of the abrasive liquid attached to the polished surface of the substrate is not rapidly changed.

2. A method according to claim 1, wherein the cleaning liquid comprises electrolytic ionic water.

3. A method according to claim 1, further comprising changing the pH of the cleaning liquid during said cleaning.

4. A method according to claim 3, wherein said cleaning is conducted at one location and the pH of the cleaning liquid is gradually changed from acid or alkali to neutrality.

5. A method according to claim 3, wherein said cleaning is conducted at a plurality of locations and the pH of the cleaning liquid is stepwise changed from acid or alkali to neutrality.

6. A method according to claim 3, wherein the pH of the cleaning liquid is changed by using at least two kinds of cleaning liquid.

7. A method according to claim 6, wherein the two kinds of cleaning liquid comprise one of acid liquid and alkali liquid, and neutral liquid.

8. A method according to claim 7, wherein said cleaning is conducted by supplying the one of acid liquid and alkali liquid, and then supplying a mixture of the one of acid liquid and alkali liquid and the neutral liquid, and then supplying the neutral liquid.

9. A method according to claim 1, wherein said polishing comprises contacting the substrate with the polishing surface; and further comprising dressing the polishing surface by supplying a dressing liquid having substantially the same pH as the abrasive liquid or similar pH to the abrasive liquid so that the pH of the abrasive liquid on the polishing surface is not rapidly changed.

10. A method according to claim 9, wherein the dressing liquid comprises electrolytic ionic water.

11. A method for polishing and then cleaning a substrate, said method comprising:

polishing a substrate using an abrasive liquid containing abrasive particles; and cleaning a polished surface of the substrate by supplying a cleaning liquid having substantially the same pH as the abrasive liquid or similar pH to the abrasive liquid so that the pH of the abrasive liquid remaining on the polished surface of the substrate after said polishing is not rapidly changed.

* * * * *